(12) United States Patent
Wang et al.

(10) Patent No.: US 7,803,641 B2
(45) Date of Patent: Sep. 28, 2010

(54) MOLD STRUCTURE FOR PACKAGING LED CHIPS AND METHOD THEREOF

(75) Inventors: Bily Wang, Hsinchu (TW); Jonnie Chuang, Taipei County (TW); Hui-Yen Huang, Hsin Chu (TW)

(73) Assignee: Harvatek Corporation, Hsinchu (TW)

( * ) Notice: Subject to any disclaimer, the term of this patent is extended or adjusted under 35 U.S.C. 154(b) by 269 days.

(21) Appl. No.: 11/854,066

(22) Filed: Sep. 12, 2007

(65) Prior Publication Data

US 2008/0160658 A1 Jul. 3, 2008

(30) Foreign Application Priority Data

Jan. 3, 2007 (TW) .............................. 96100234 A

(51) Int. Cl.
*H01L 21/66* (2006.01)
*H01L 21/00* (2006.01)

(52) U.S. Cl. .............................. 438/15; 438/25; 438/55; 438/106

(58) Field of Classification Search .................... 438/15, 438/25, 55, 106
See application file for complete search history.

(56) References Cited

U.S. PATENT DOCUMENTS

| | | | | |
|---|---|---|---|---|
| 4,368,168 A * | 1/1983 | Slepcevic | .............. | 264/272.14 |
| 5,672,549 A * | 9/1997 | Minami et al. | .............. | 438/125 |
| 5,846,477 A * | 12/1998 | Hotta et al. | .................. | 264/511 |
| 6,013,947 A * | 1/2000 | Lim | ............................ | 257/685 |
| 6,081,978 A * | 7/2000 | Utsumi et al. | .............. | 29/25.01 |
| 6,309,916 B1 * | 10/2001 | Crowley et al. | ............. | 438/127 |
| 6,344,162 B1 * | 2/2002 | Miyajima | .............. | 264/272.14 |
| 6,580,620 B1 * | 6/2003 | Kim | ............................ | 361/784 |
| 6,630,374 B2 * | 10/2003 | Yamamoto | ................... | 438/124 |
| 6,670,220 B2 * | 12/2003 | Sakuraba et al. | ............ | 438/109 |
| 6,773,247 B1 * | 8/2004 | Osada et al. | .................. | 425/89 |
| 7,501,086 B2 * | 3/2009 | Kuo | ..................... | 264/272.17 |
| 2002/0024127 A1 * | 2/2002 | Sakuraba et al. | ............ | 257/686 |
| 2003/0131428 A1 * | 7/2003 | Tsuchida | .................. | 15/104.93 |
| 2005/0037178 A1 * | 2/2005 | Chou | ......................... | 428/156 |
| 2005/0242452 A1 * | 11/2005 | Takase et al. | .............. | 264/1.31 |
| 2006/0216867 A1 * | 9/2006 | Kawata et al. | .............. | 438/124 |
| 2007/0007612 A1 * | 1/2007 | Mills et al. | .................. | 257/433 |

* cited by examiner

*Primary Examiner*—Matthew C Landau
*Assistant Examiner*—James M Mitchell
(74) *Attorney, Agent, or Firm*—Rosenberg Klein & Lee

(57) ABSTRACT

A mold structure for packaging LED chips includes a top mold and a bottom mold. The bottom mold is mated with the top mold. The bottom mold has a main flow channel, a plurality of receiving spaces formed beside the main flow channel, a plurality of secondary flow channels for respectively and transversely communicating the receiving spaces with each other, and a plurality of ejection pins penetrating through the bottom mold.

17 Claims, 18 Drawing Sheets

MOLD STRUCTURE FOR PACKAGING LED CHIPS AND METHOD THEREOF

BACKGROUND OF THE INVENTION

1. Field of the Invention

The present invention relates to a mold structure for packaging LED chips and a method thereof, and particularly relates to a mold structure and a method for preventing package resins from overflowing on a rear face of a substrate of the LED chips.

2. Description of the Related Art

Referring to FIGS. 1 and 2, a known mold structure m includes a top mold 1a and a bottom mold 2a mated with the top mold 1a. The bottom mold 2a has a plurality of receiving spaces 20a of a larger size.

Referring to FIG. 3, a substrate 3a is etched to form a plurality of chip carrying areas 30a and a plurality of positive contact pins 300a and negative contact pins 301a that correspond to the chip carrying areas 30a.

Moreover, a plurality of LED chips 4a is arranged on the corresponding chip carrying areas 30a, respectively. In addition, a positive pole and a negative pole (not shown) of each LED chip 4a are electrically connected with the corresponding positive contact pin 300a and negative contact pin 301a via leading wires 40a by a wire-bounding method. Furthermore, the LED chips 4a are divided into a plurality of LED chip areas. Each LED chip area has a plurality of LED chips 4a arranged in a matrix shape. For example, in the FIG. 3 each LED chip area has a 5*5 LED chip matrix.

Referring to FIG. 4, before the substrate 3a is arranged under the top mold 1a, a self-adhesive tape 5a is attached on a rear face of the substrate 3a.

Referring to FIG. 5, after the top mold 1a and the bottom mold 2a are mated together and package resins 6a are poured into the receiving spaces 20a, the substrate 3a is deformed easily and the package resins 6a overflow easily on the rear face (as shown by the arrows in FIG. 5) of the substrate 3a due to thermal expansion and pressure concentration (because the size of the receiving space 20a is larger). Hence, the know mold structure not only wastes package resins but it is difficult to clean the package resins that overflow on the substrate.

Moreover, the prior art still some other defects, as follows:

1. The cost of the self-adhesive tape 5a is high, and the prior art needs to use a precision adhesion instrument to adhere the self-adhesive tape 5a on the rear face of the substrate 3a.

2. The LED chips 4a are too close to each other, so that the structural strength of the LED chip package is inadequate.

3. Because the size of the receiving spaces is larger, the packaged LED chips 4a are difficult to separate from the bottom mold 2a. Therefore, the yield rate of the pattern draw is decreased.

SUMMARY OF THE INVENTION

One particular aspect of the present invention is to provide a mold structure for packaging LED chips and a method thereof. The present invention prevents package resins from overflowing on a rear face of a substrate of the LED chips.

In order to achieve the above-mentioned aspects, the present invention provides a mold structure for packaging LED chips, comprising a top mold and a bottom mold. The bottom mold is mated with the top mold. The bottom mold has a main flow channel, a plurality of receiving spaces formed beside the main flow channel, a plurality of secondary flow channels for respectively and transversely communicating the receiving spaces with each other, and a plurality of ejection pins penetrating through the bottom mold.

In order to achieve the above-mentioned aspects, the present invention provides a method of packaging LED chips, comprising: providing a top mold and a bottom mold that are mated with each other, wherein the bottom mold has a main flow channel, a plurality of receiving spaces formed beside the main flow channel, a plurality of secondary flow channels for respectively and transversely communicating the receiving spaces with each other, and a plurality of ejection pins penetrating through the bottom mold; and then pressing a plurality of wire-bonded LED chips that have finished a wire-bonding process into the corresponding receiving spaces via the top mold mating with the bottom mold.

The method further comprises pouring package resins from the main flow channel to each receiving space through the secondary flow channels and filling each receiving space with package resins for packaging each wire-bonded LED chip, and then removing upward the top mold so that the top mold is separated from the packaged LED chips that have been packaged; and then pushing the packaged LED chips out of the bottom mold via the ejection pins.

Hence, the mold structure and the method for packaging LED chips have some advantages, as follows:

1. Because the size of the receiving spaces is small, the structural strength of the substrate is increased by matching the receiving spaces and a support. Therefore, the present invention prevents the package resins from overflowing on a rear face of the substrate.

2. Because the present invention does not need to use adhesive tape, costs are reduced.

3. Because the size of the receiving spaces is small, the packaged LED chips are separated easily from the bottom mold by matching the receiving spaces and the support. Therefore, the yield rate of the pattern draw is increased.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which.

DETAILED DESCRIPTION OF THE PREFERRED EMBODIMENTS

Figure 1:
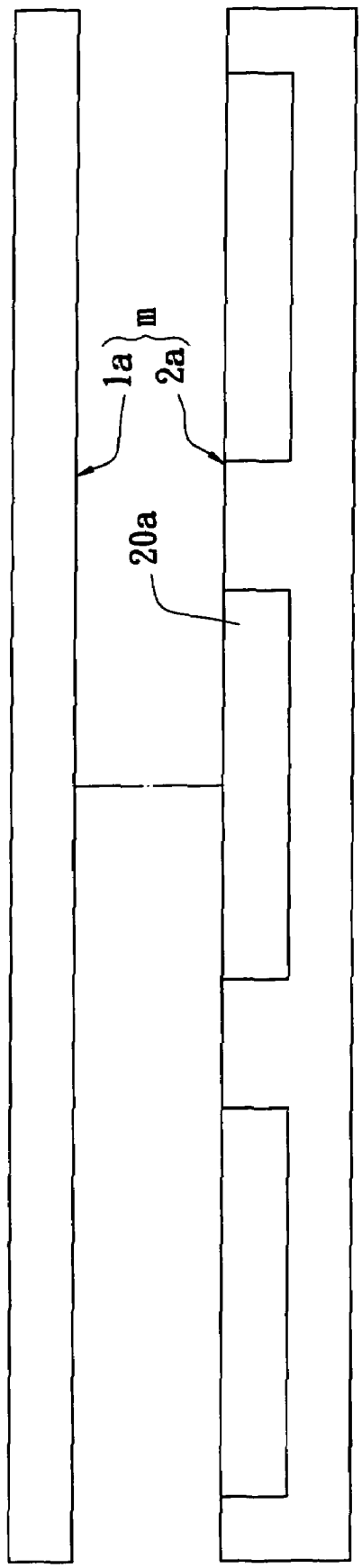
FIG. 1 is a lateral, exploded, schematic view of a mold structure for packaging LED chips according to the prior art.
Figure 2:
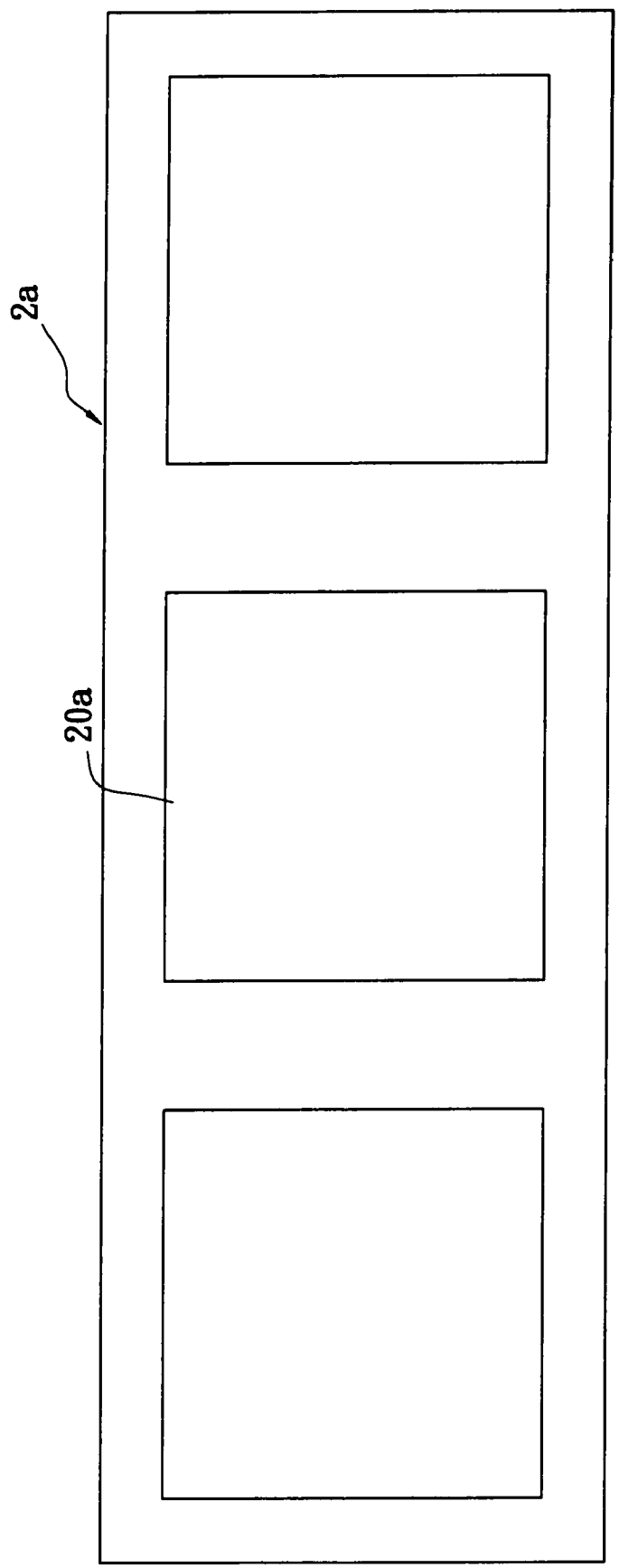
FIG. 2 is a top view of a bottom mold of the prior art.
Figure 3:
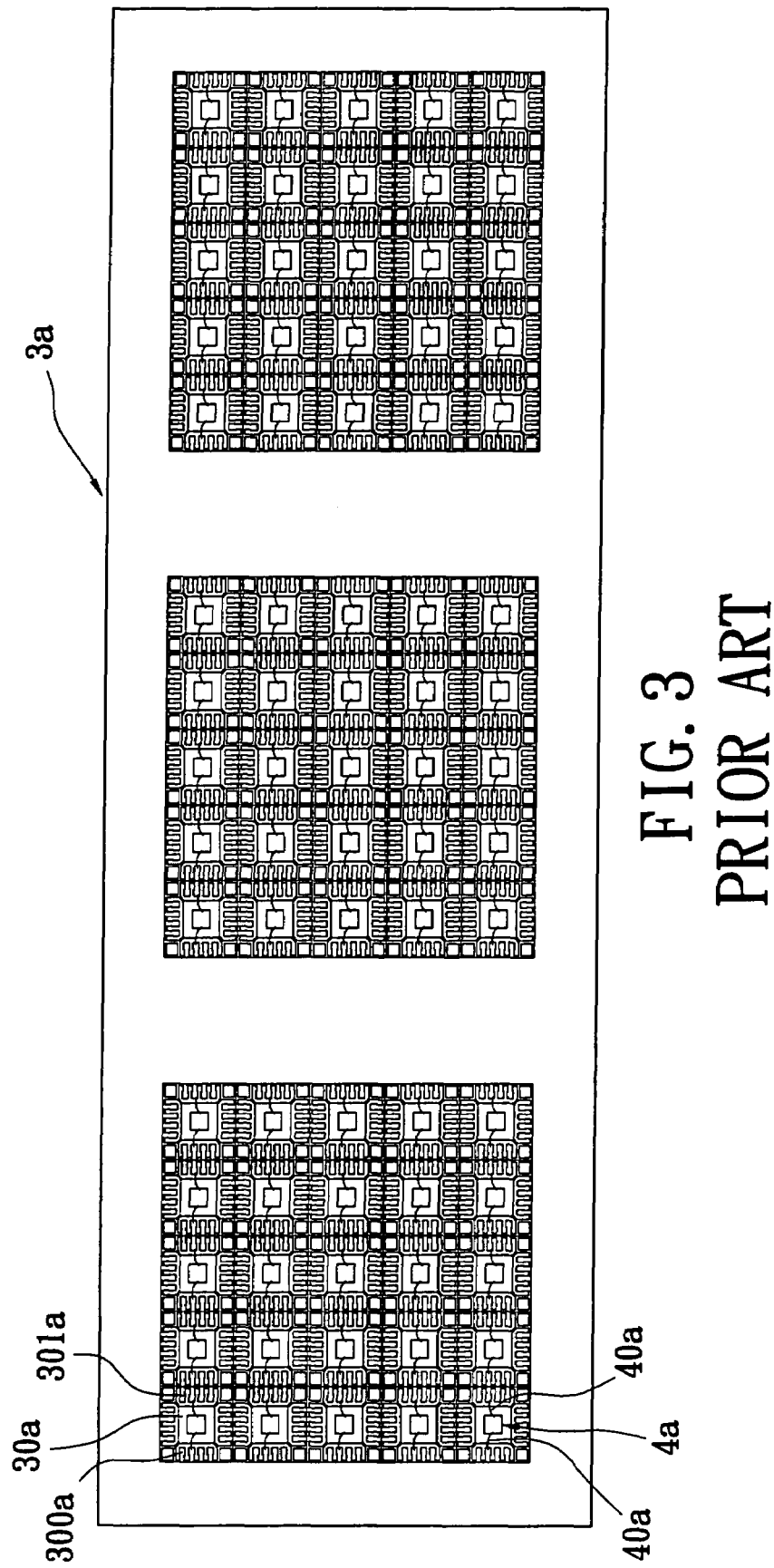
FIG. 3 is a top view of LED chips disposed on a substrate (sheet) according to the prior art.
Figure 4:
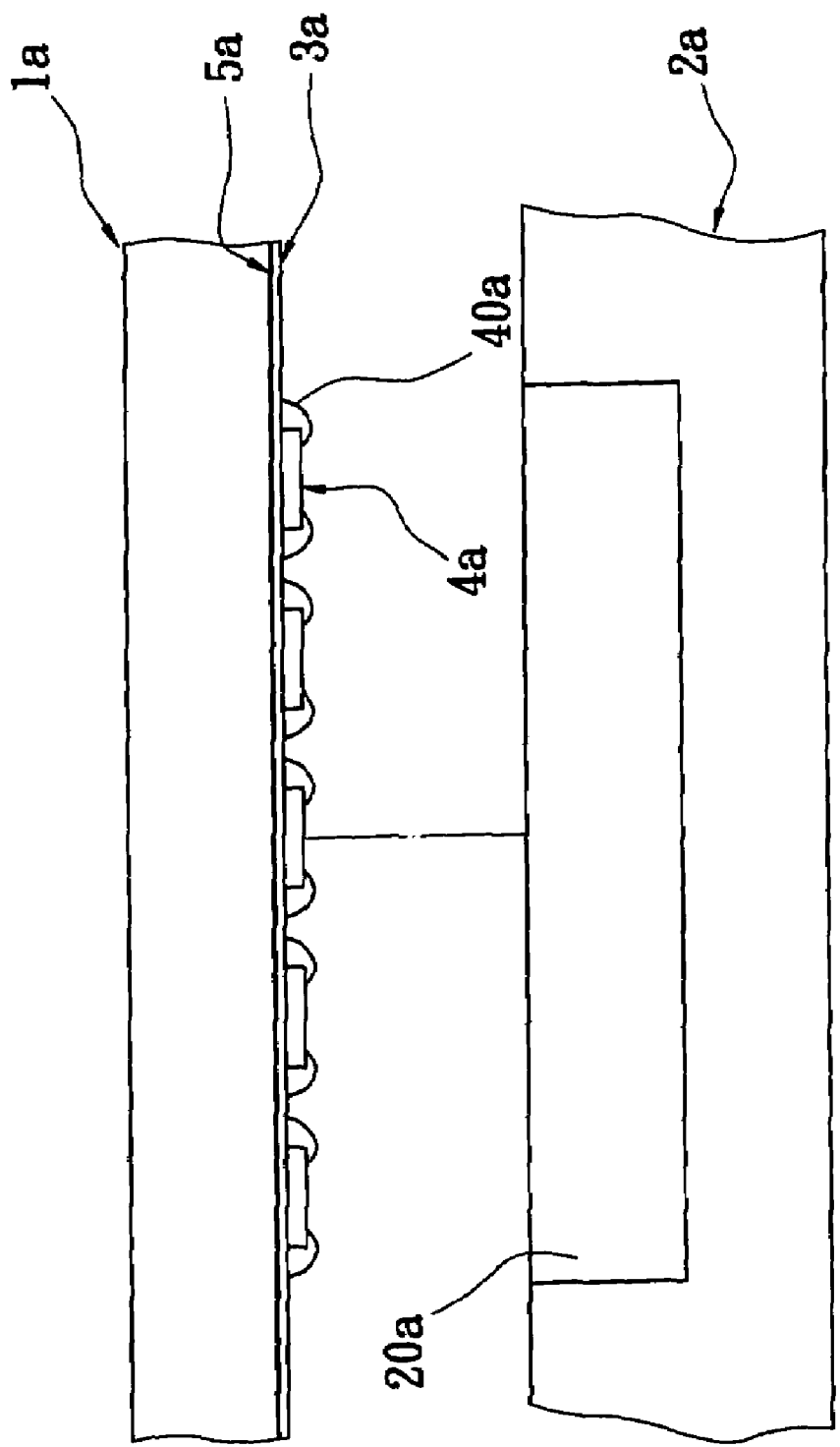
FIG. 4 is a schematic view (before a top mold and a bottom mold are mated together) according to the prior art.
Figure 5:
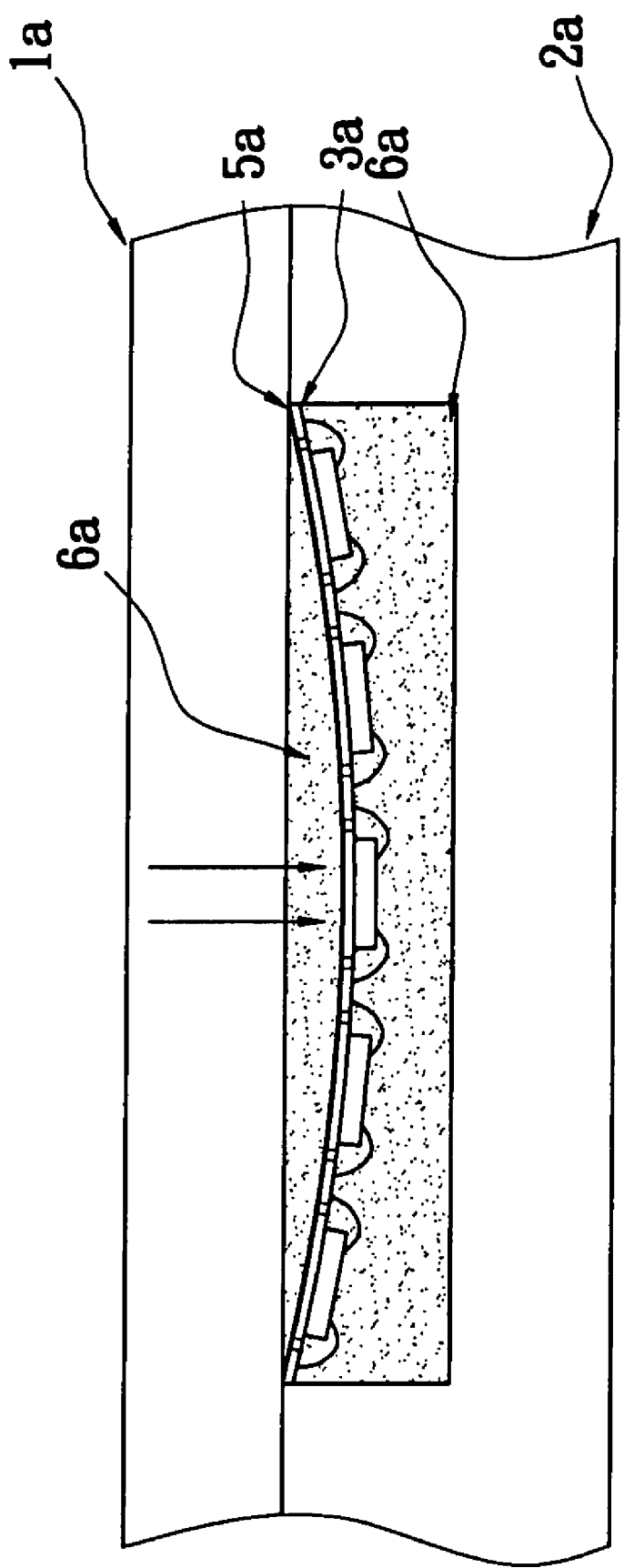
FIG. 5 is a schematic view (when package resin overflows on a rear face of an adhesive tape) according to the prior art.
Figure 6:
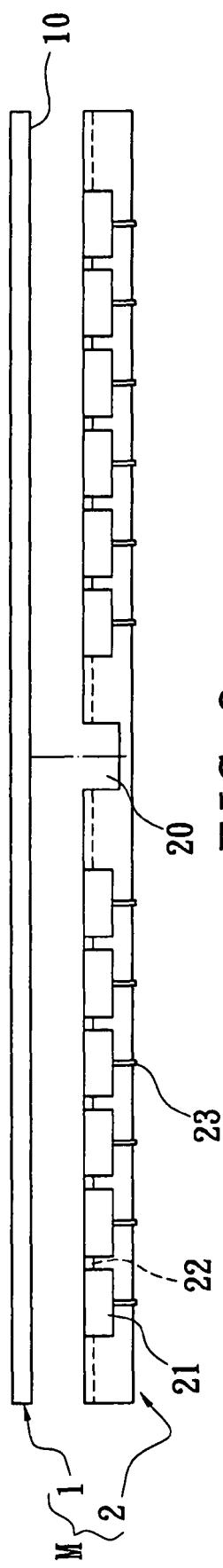
FIG. 6 is a lateral, exploded, schematic view of a mold structure for packaging LED chips according to the present invention.

Referring to FIG. 6, the present invention provides a mold structure M for packaging LED chips, including: a top mold 1 and a bottom mold 2 mated with the top mold 1. The top mold 1 has a plane 10 facing the bottom mold 2 for mating with the bottom mold 2.

Figure 7:
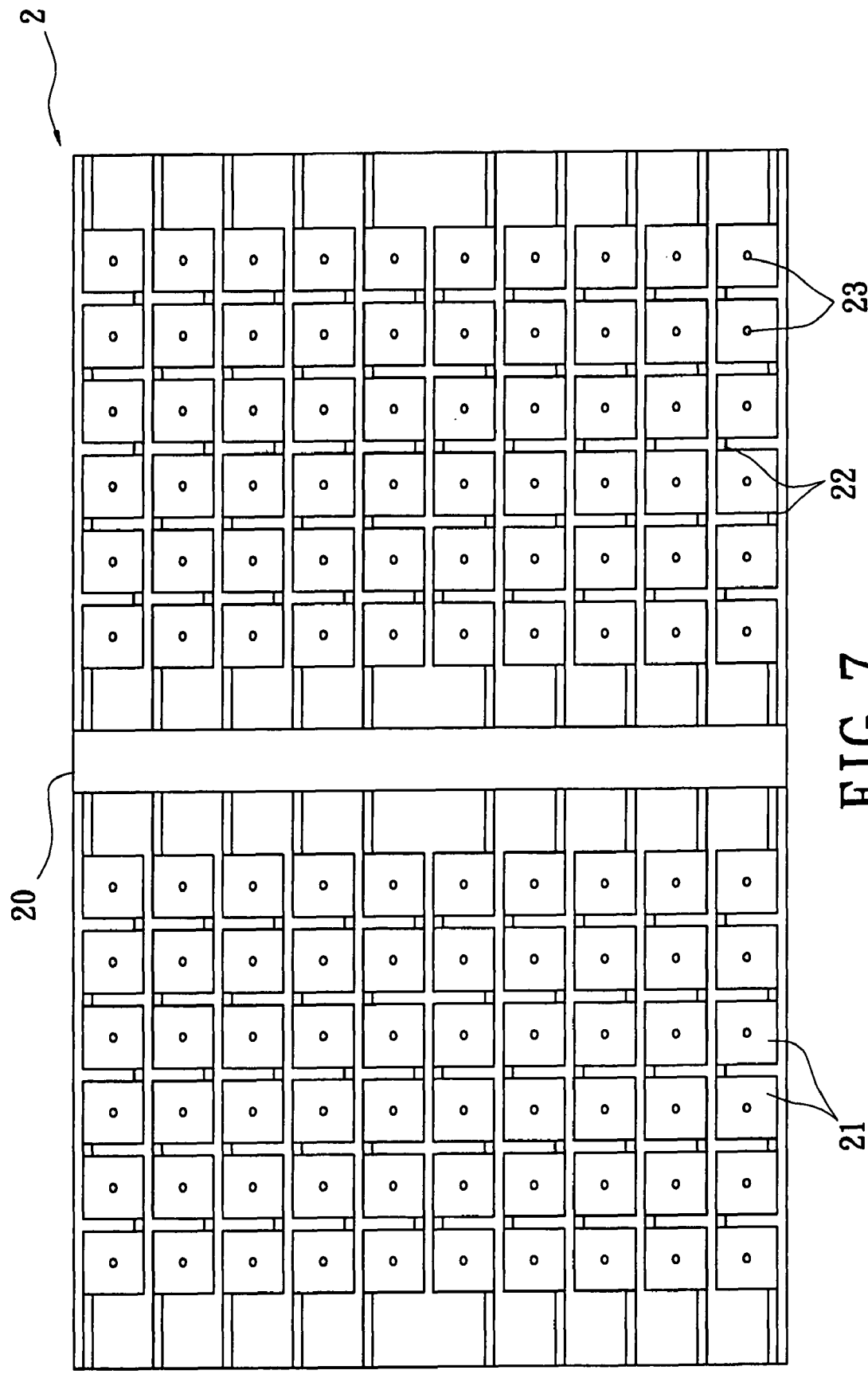
FIG. 7 is a top view of a bottom mold of a mold structure for packaging LED chips according to the first embodiment of the present invention.

Referring to FIGS. 6 and 7, with regard to the first embodiment of the present invention, the bottom mold 2 has a main flow channel 20, a plurality of receiving spaces 21, a plurality of secondary flow channels 22, and a plurality of ejection pins 23.

Moreover, the receiving spaces 21 are arranged in a matrix shape. The receiving spaces 21 are respectively formed beside two opposite sides of the main flow channel 20. In addition, the secondary flow channels 22 are alternately disposed on one lateral side between each two receiving spaces 21 for respectively and transversely communicating the receiving spaces 21 with each other. In other words, the transverse receiving spaces 21 are communicated with each other via the corresponding secondary flow channels 22. Furthermore, the ejection pins 23 penetrate through the bottom mold 2, and each ejection pin 23 is expansibly projected into the corresponding receiving space 21.

Figure 8:
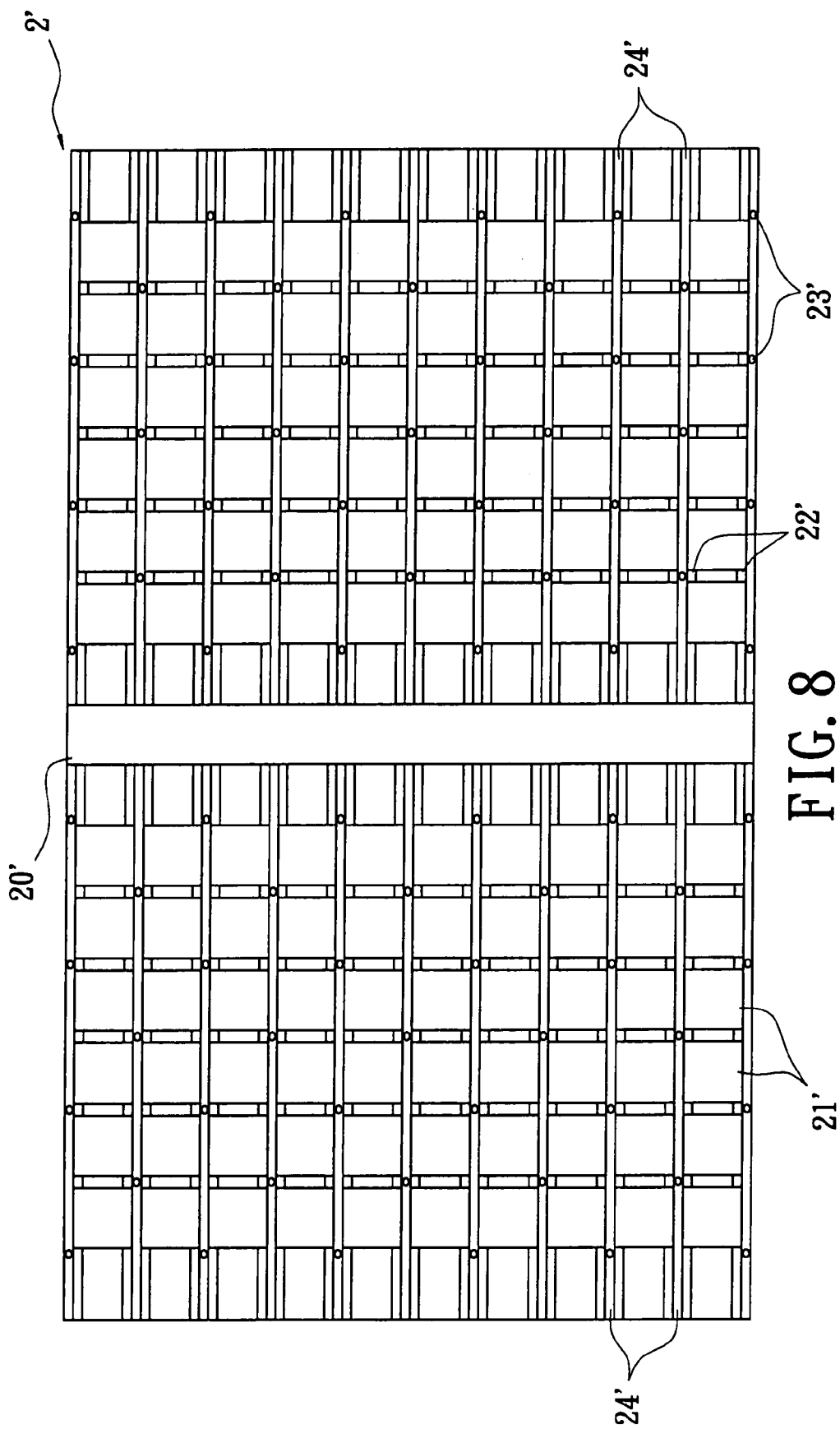
FIG. 8 is a top view of a bottom mold of a mold structure for packaging LED chips according to the second embodiment of the present invention.

Referring to FIG. 8, with regard to the second embodiment of the present invention, a bottom mold 2' has a main flow channel 20', a plurality of receiving spaces 21', a plurality of secondary flow channels 22', and a plurality of ejection pins 23'.

The receiving spaces 21' are arranged in a matrix shape. The receiving spaces 21' are respectively formed beside two opposite sides of the main flow channel 20'. In addition, each two secondary flow channels 22' are formed on two opposite lateral sides between each two receiving spaces 21' for respectively and transversely communicating the receiving spaces 21 with each other'. In other words, the transverse receiving spaces 21' are communicated with each other via the corresponding secondary flow channels 22'. Furthermore, the ejection pins 23' penetrate through the bottom mold 2', and each ejection pin 23' is expansibly projected outside a support 24' of the bottom mold 2' and among a part of the receiving spaces 21'.

However, the structure of the bottom molds 2, 2' should not be used to limit the present invention. For example, the receiving spaces 21, 21' can be formed beside the same side of the main flow channel 20, 20'.

Figure 9:
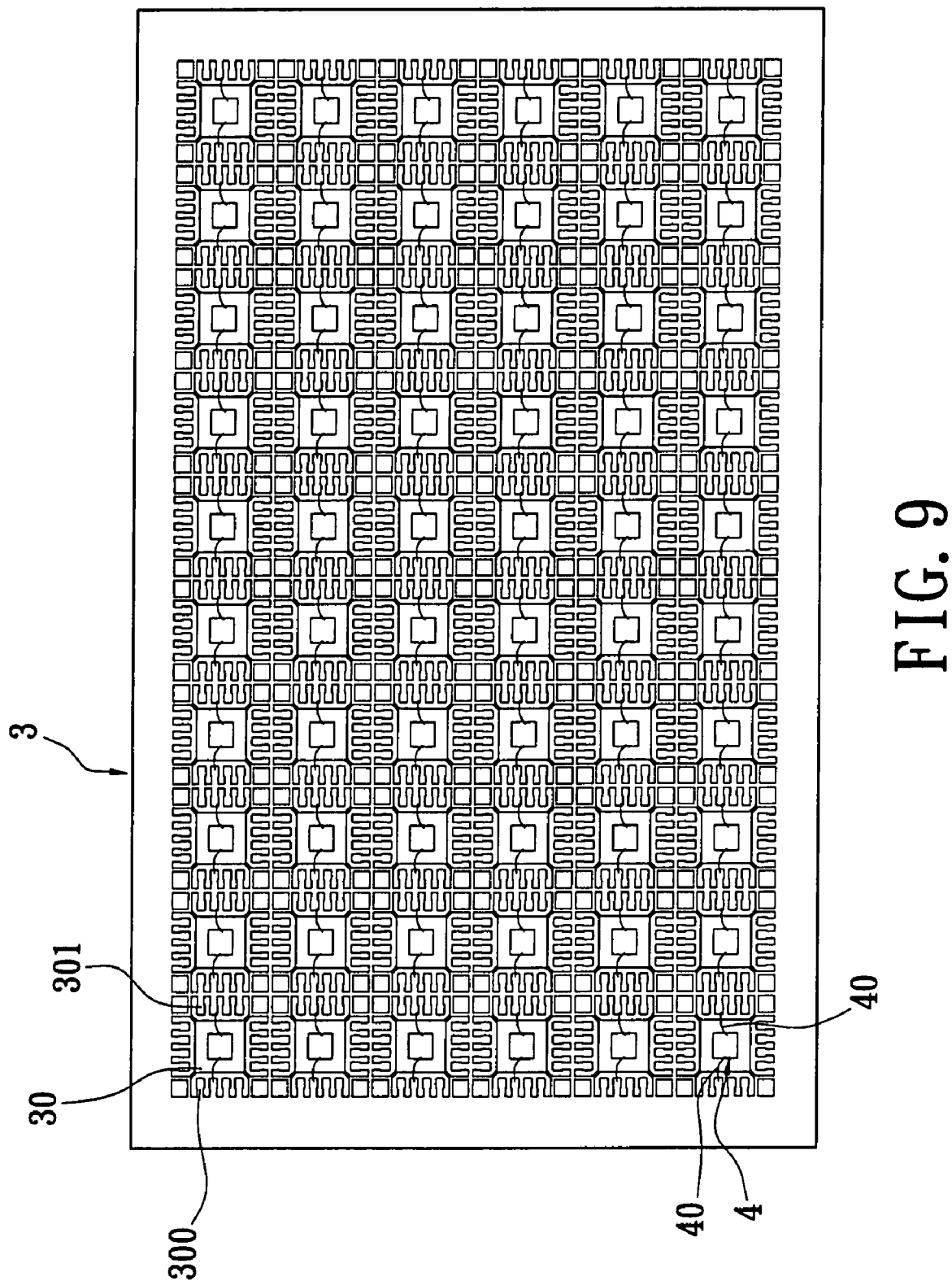
FIG. 9 is a top view of LED chips disposed on a substrate (sheet) according to the present invention.
Figure 10:
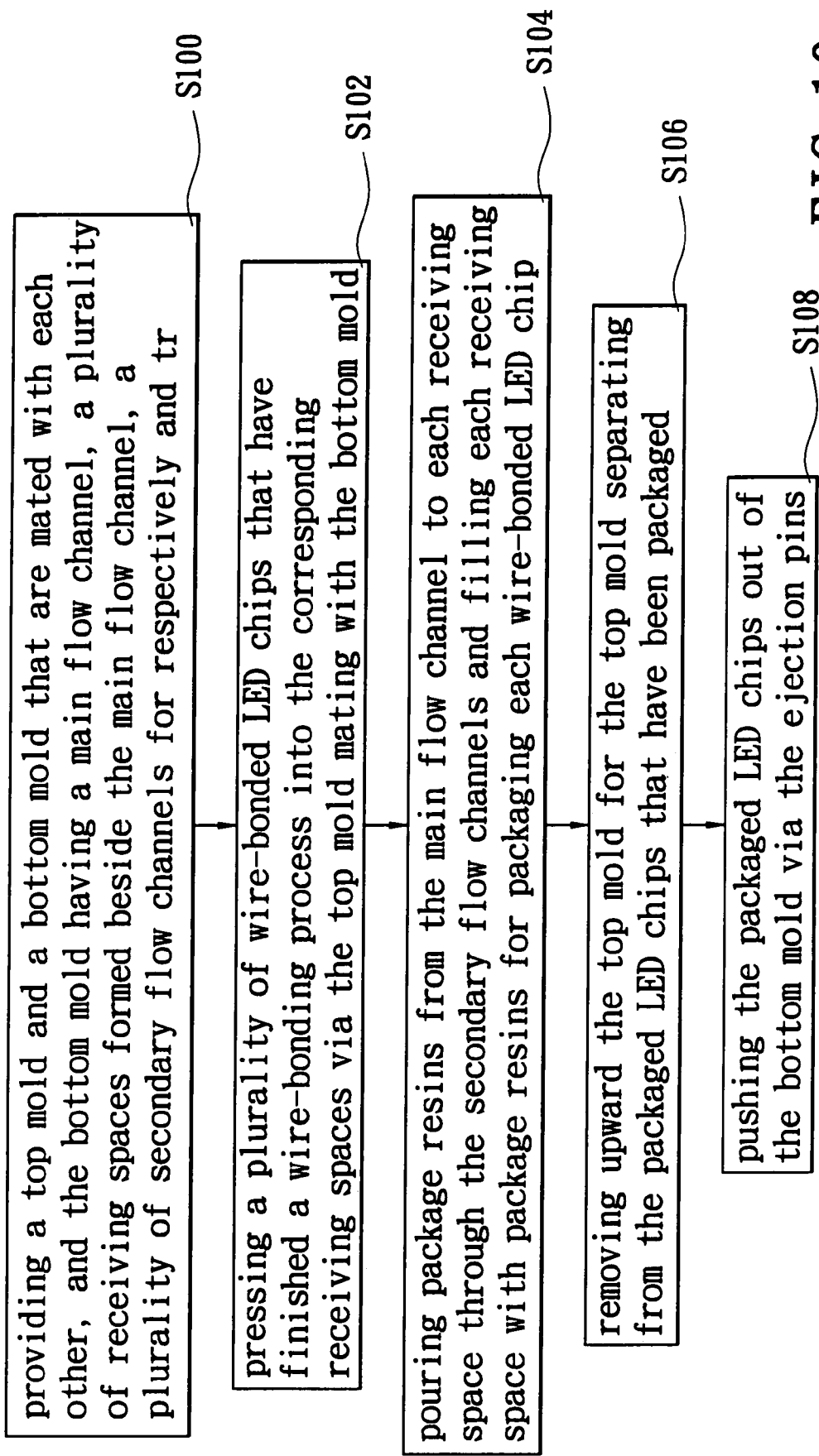
FIG. 10 is a flowchart of a method of packaging LED chips according to the present invention.

Referring to FIG. 9, a substrate 3 is etched to form a plurality of chip carrying areas 30 and a plurality of positive contact pins 300 and negative contact pins 301 that correspond to the chip carrying areas 30. A plurality of LED chips 4 is arranged on the corresponding chip carrying areas 30, respectively. In addition, a positive pole and a negative pole (not shown) of each LED chip 4 are electrically connected with the corresponding positive contact pin 300 and negative contact pin 301 via leading wires 40 by a wire-bounding method.

Referring to FIGS. 10 and 11A-11E, the present invention provides a method of packaging LED chips. The method includes the following steps: firstly, referring to FIG. 11A, providing a top mold 1 and a bottom mold 2 that are mated with each other, and the bottom mold 2 having a main flow channel 20 (as shown in FIG. 6), a plurality of receiving spaces 21 formed beside the main flow channel 20, a plurality of secondary flow channels 22 for respectively and transversely communicating the receiving spaces 21 with each other, and a plurality of ejection pins 23 penetrating through the bottom mold 2 (S100).

Figure 11A:
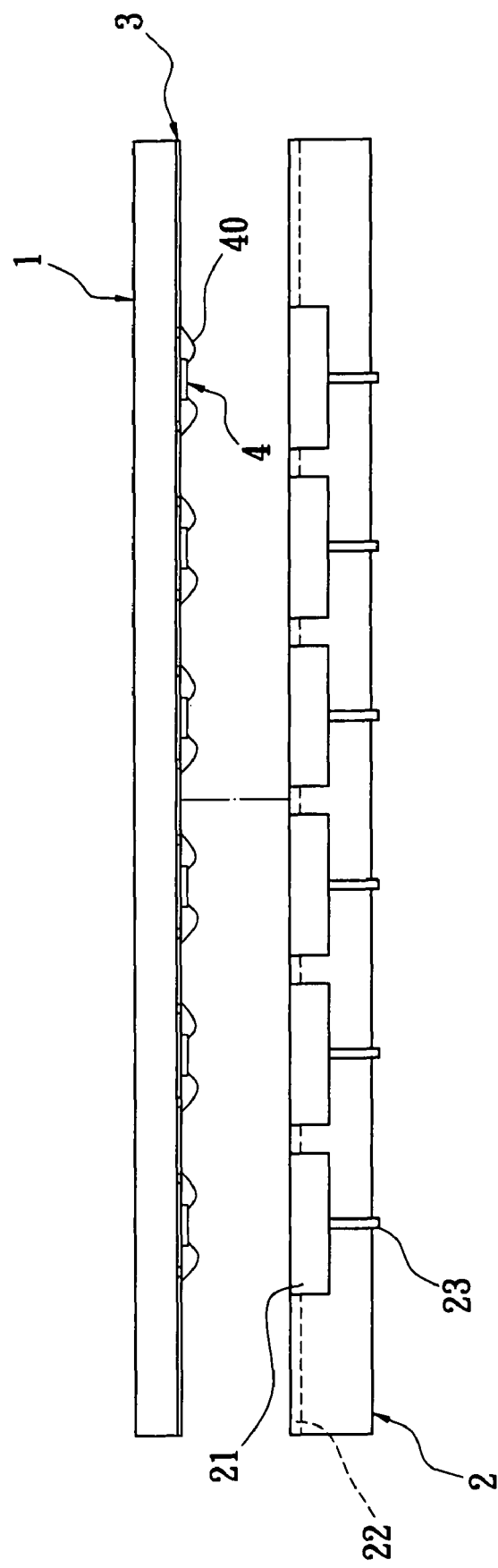
FIGS. 11A to 11E are packaging schematic views of a method of packaging LED chips according to the present invention.
Figure 11B:
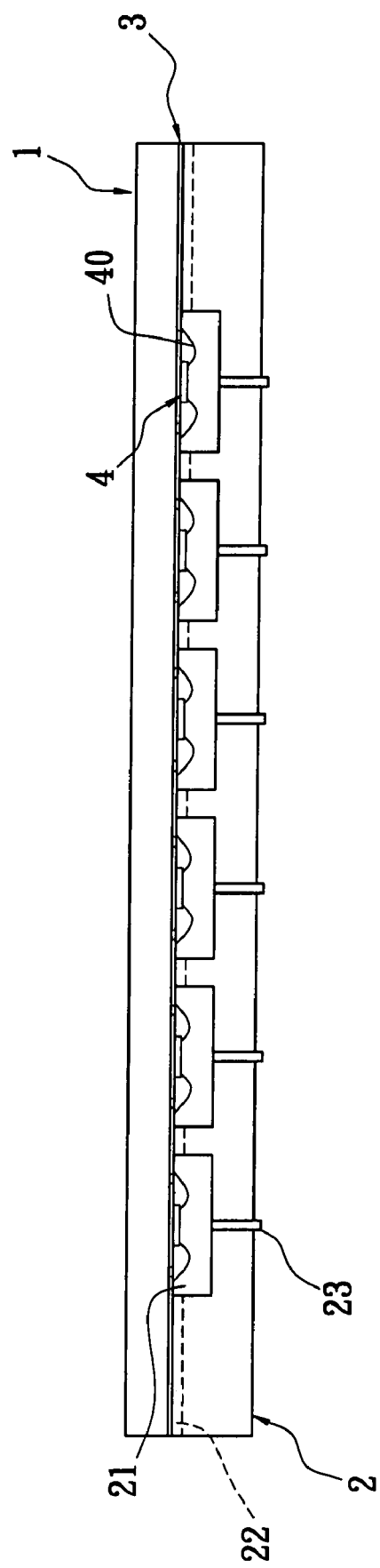

Next, referring to FIG. 11B, the method includes pressing a plurality of wire-bonded LED chips 4 that have finished a wire-bonding process into the corresponding receiving spaces 21 via the top mold 1 mating with the bottom mold 2 (S102).

Figure 11C:
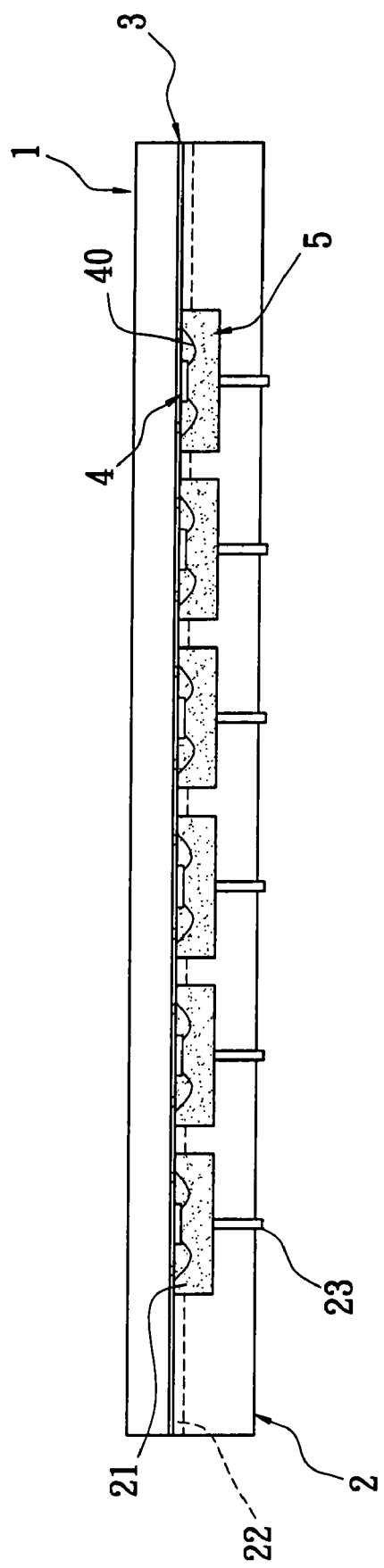

Thirdly, referring to FIG. 11C, the method includes pouring package resins 5 from the main flow channel 20 to each receiving space 21 through the secondary flow channels 22 and filling each receiving space 21 with package resins 5 for packaging each wire-bonded LED chip 4 (S104).

Figure 11D:
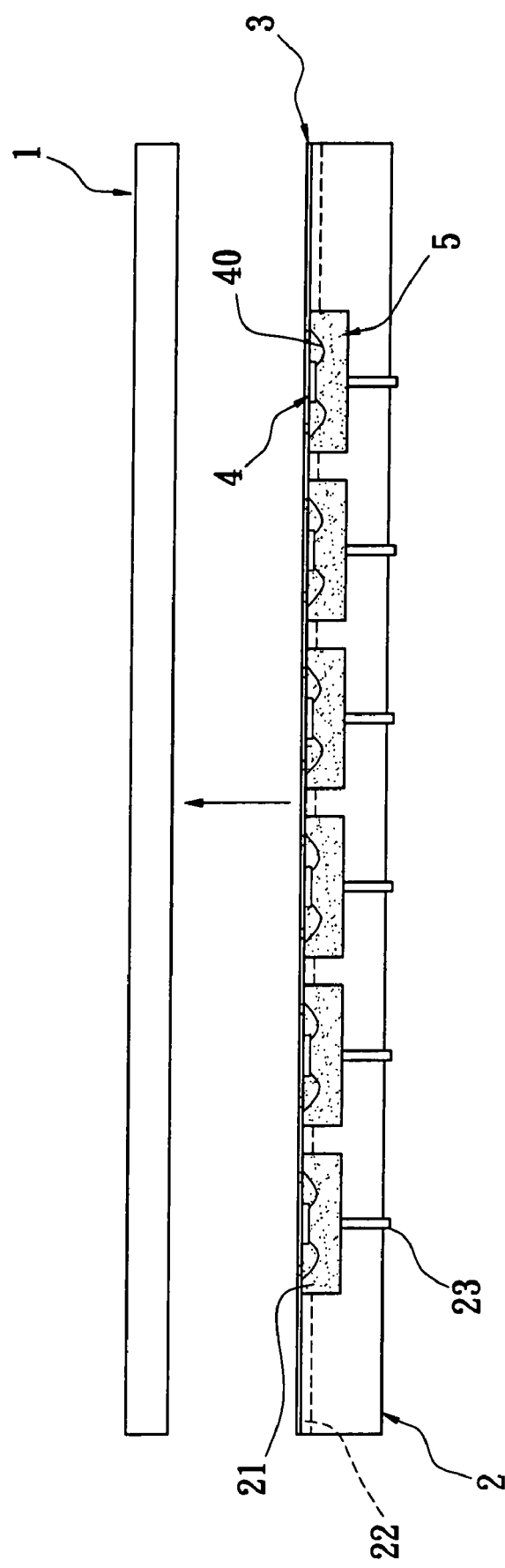

Fourthly, referring to FIG. 11D, the method includes removing upward the top mold 1 (the top mold 1 is separated from the bottom mold 2 at the same time) for the top mold 1 separating from the packaged LED chips 4 that have been packaged (S106).

Figure 11E:
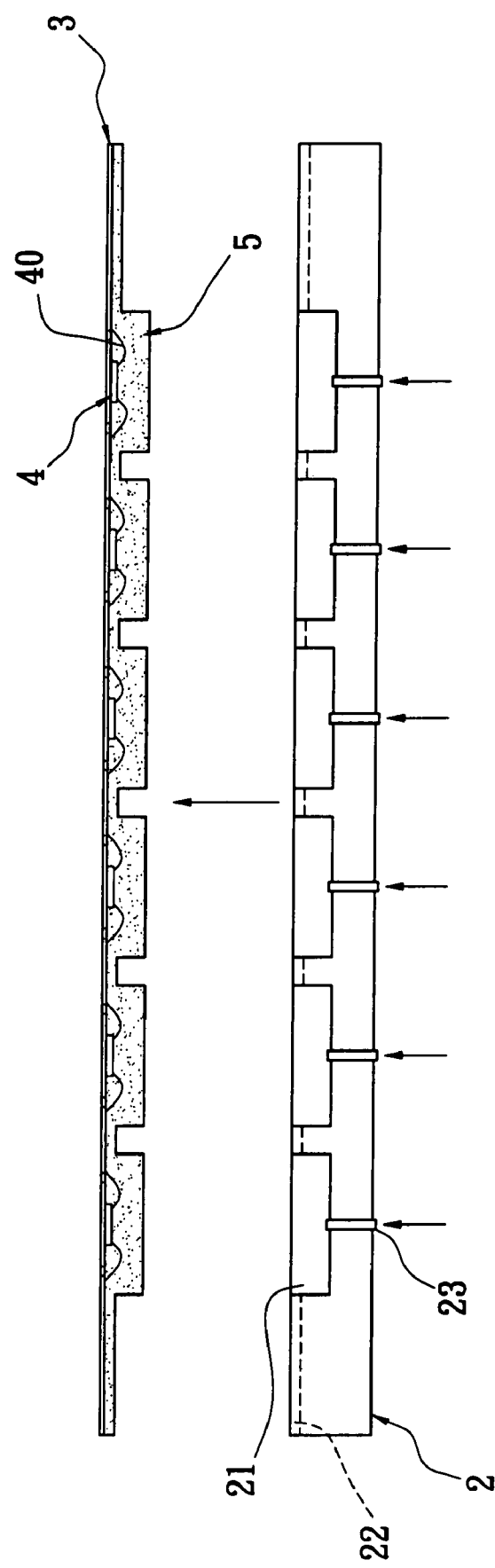

According to the first embodiment, and referring to FIG. 11E, the method includes pushing the packaged LED chips 4 out of the bottom mold 2 via the ejection pins 23 (S108). In addition, each ejection pin 23 is expansibly projected into the corresponding receiving space 21.

Figure 12:
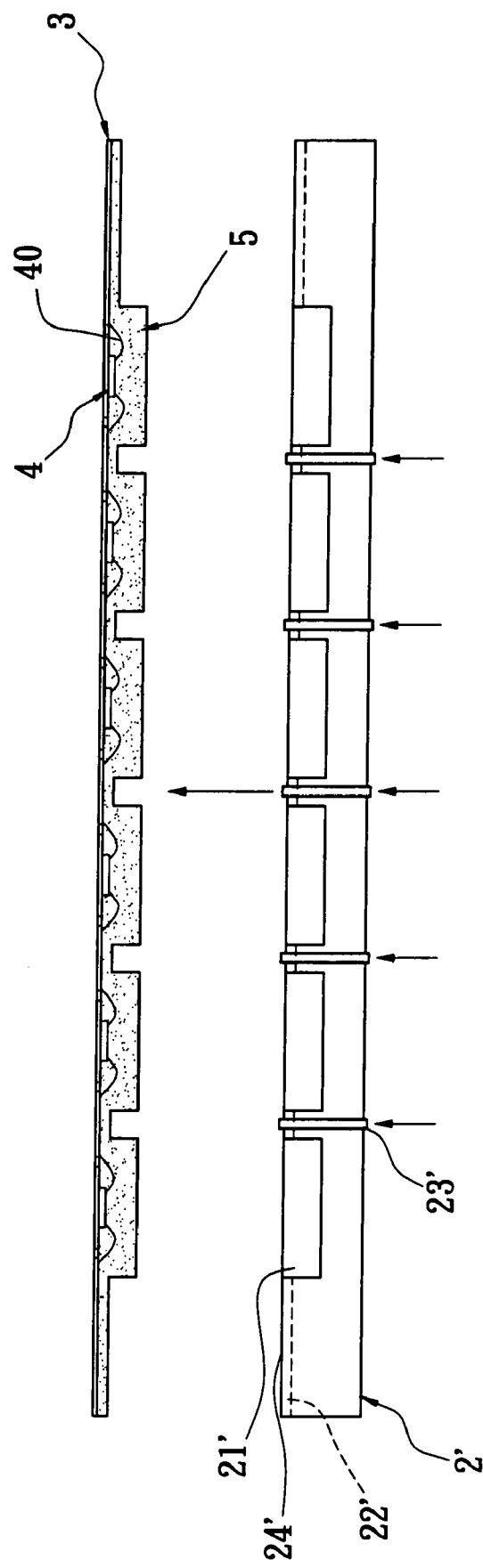
FIG. 12 is a schematic view of packaged LED chips separated from a bottom mold via ejection pins according to the present invention.

According to the second embodiment, and referring to FIG. 12, the method includes pushing the packaged LED chips 4 out of the bottom mold 2 via the ejection pins 23' (S108). In addition, each ejection pin 23' is expansibly projected outside the support 24' of the bottom mold 2' and among a part of the receiving spaces 21'.

Figure 13:
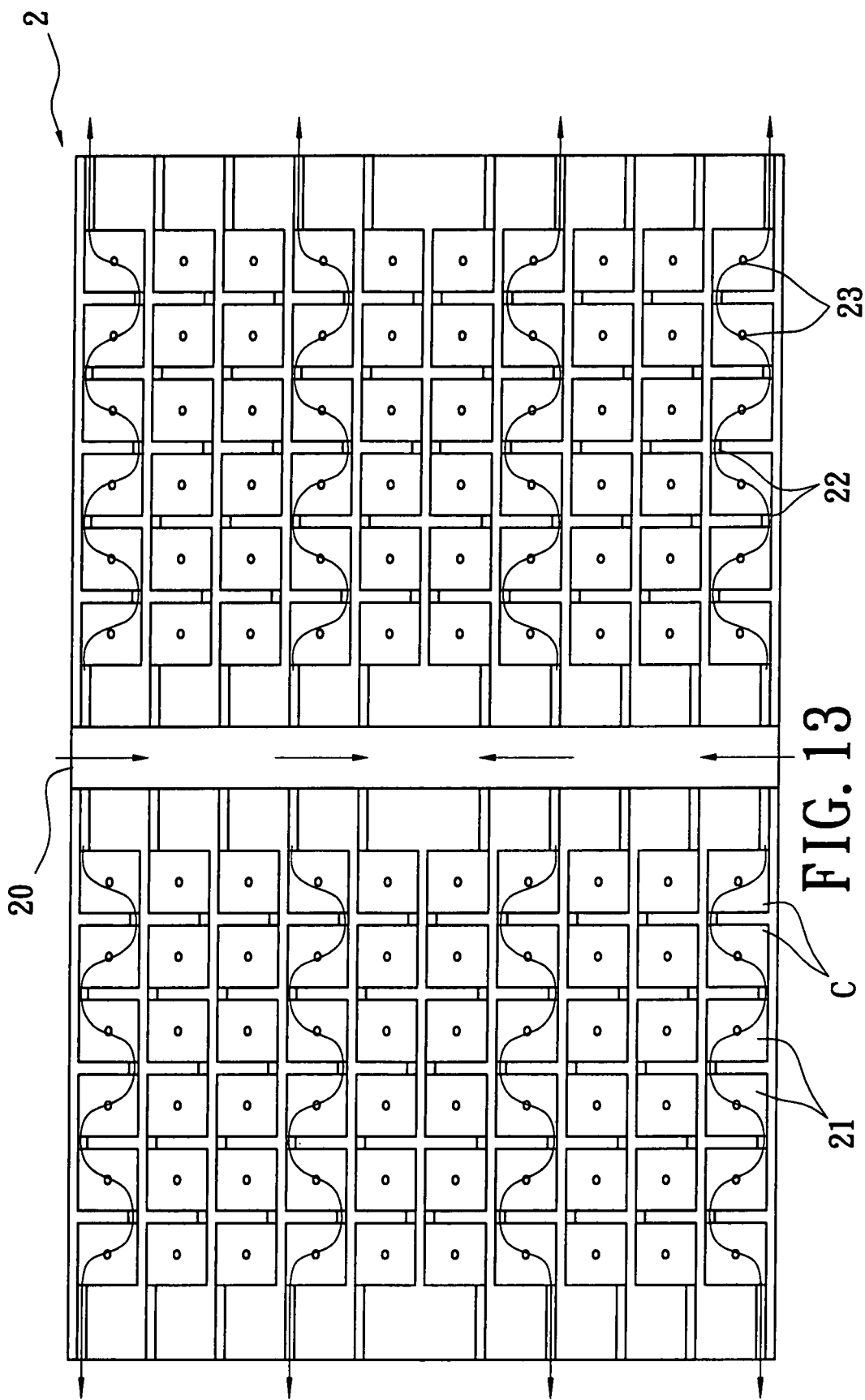
FIG. 13 is a schematic view of liquid package resin pouring into receiving spaces according to the first embodiment of the present invention.

Referring to FIG. 13, in the first embodiment, the secondary flow channels 22 are alternately disposed on one lateral side between each two receiving spaces 21 for making the receiving spaces 21 and the secondary flow channels 22 mate with each other to form a plurality of continuous S-shaped flow channels (as shown by the arrows in FIG. 13). Hence, it is easy for the package resins 5 to fill in the receiving spaces 21 to the full. In addition, the design ensures that the corners C in the receiving spaces 21 are filled with the package resin 5, thus ensuring that packaging defects are avoided.

Figure 14:
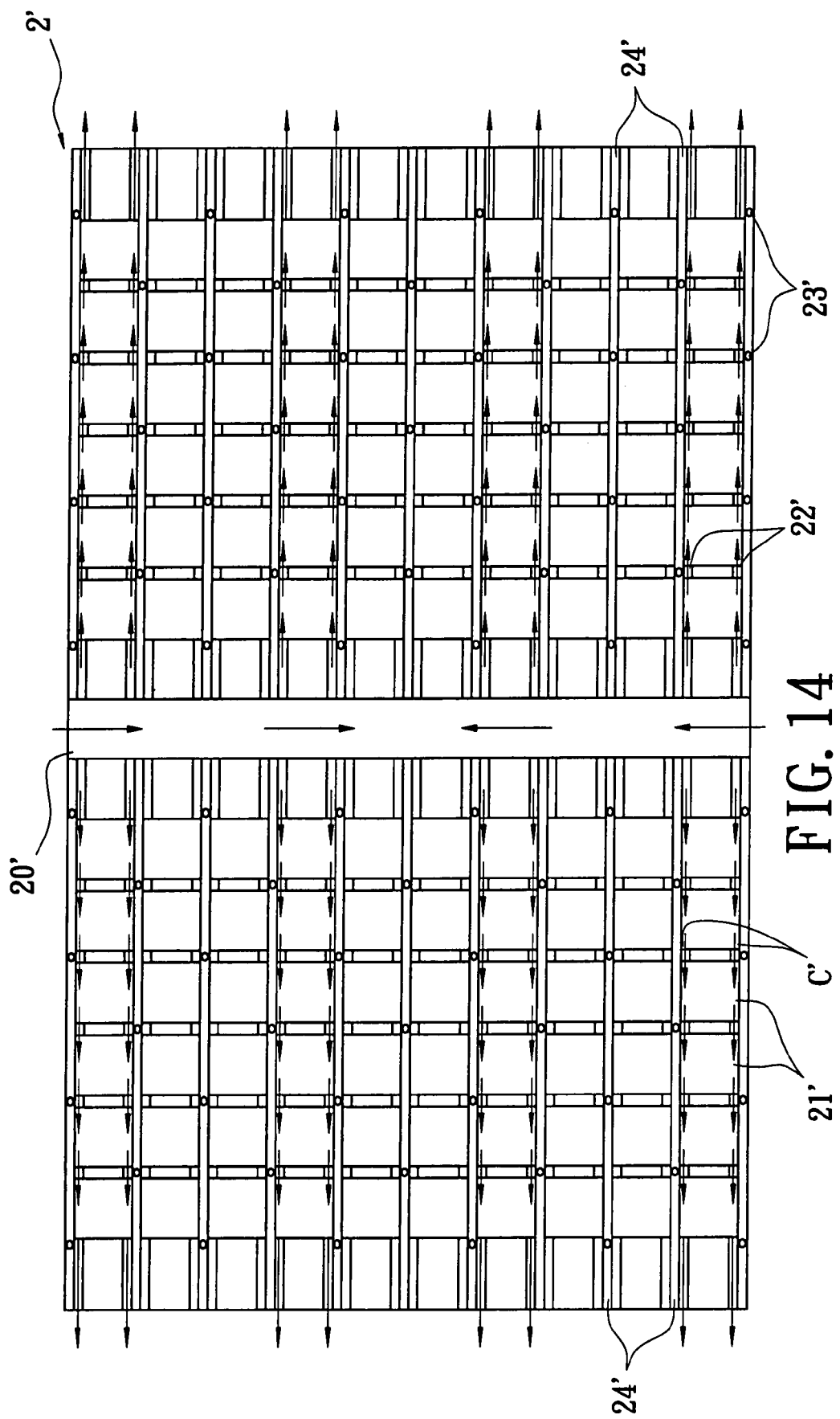
FIG. 14 is a schematic view of liquid package resin pouring into receiving spaces according to the second embodiment of the present invention.

Referring to FIG. 14, in the second embodiment, each two secondary flow channels 22' are formed on two opposite lateral sides between each two receiving spaces 21'. Hence, it is easy for the package resins 5 to fill in the receiving spaces 21' to the full. In addition, following the same principle described above, the design ensures that the corners C' in the receiving spaces 21' are filled with the package resin 5, thus ensuring that packaging defects are avoided.

In conclusion, the mold structure and the method for packaging LED chips have some advantages, as follows:

1. Because the size of the receiving spaces (21 or 21') is small, the structural strength of the substrate 3 is increased by matching the receiving spaces (21 or 21') and the support 24'. Therefore, the present invention prevents the package resins from overflowing on a rear face of the substrate 3.

2. Because the present invention does not need to use adhesive tapes, costs are reduced.

3. Because the size of the receiving spaces (21 or 21') is small, the packaged LED chips 4 are separated easily from the bottom mold (2 or 2') by matching the receiving spaces (21 or 21') and the support 24'. Therefore, the yield rate of the pattern draw is increased.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A mold structure for packaging LED chips, comprising:
   a top mold;
   a bottom mold mated with the top mold, wherein the bottom mold includes:
   a main flow channel,
   a series of receiving spaces formed beside the main flow channel, each of said first and second receiving spaces having an inner surface, said first receiving space directly communicated with said main flow channel; and
   a plurality of secondary flow channels for respectively and transversely communicating said first of said receiving spaces of said series with said second of said receiving spaces of said series each with the other, said second of said series of receiving spaces indirectly communicated with said main flow channel through said first of said series of receiving spaces, each of said plurality of secondary flow channels having an inner surface;
   a plurality of ejection pins penetrating through the bottom mold; and
   a package resin received within said each receiving space in direct contact with said inner surface thereof and within said each secondary flow channel in direct contact with said inner surface thereof, wherein said ejection pins communicate at one end thereof directly with a bottom of said package resin;
   wherein the plurality of secondary flow channels are alternately disposed at one lateral side between neighboring receiving spaces, thereby forming a plurality of continuous S-shaped communicated flow channels connecting said series of receiving spaces with said plurality of secondary flow channels.

2. The mold structure as claimed in claim 1, wherein the top mold has a plane facing the bottom mold for mating with the bottom mold.

3. The mold structure as claimed in claim 1, wherein the receiving spaces are arranged in a matrix shape.

4. The mold structure as claimed in claim 1, wherein each two secondary flow channels are formed at two opposite lateral sides between neighboring receiving spaces.

5. The mold structure as claimed in claim 1, wherein the receiving spaces are formed beside the same side of the main flow channel.

6. The mold structure as claimed in claim 1, wherein the receiving spaces are respectively formed beside two opposite sides of the main flow channel.

7. The mold structure as claimed in claim 1, wherein each of said plurality of ejection pins is expansibly projected into a corresponding receiving space through a bottom thereof.

8. The mold structure as claimed in claim 1, wherein each of said plurality of ejection pins is expansibly projected between neighboring receiving spaces into said each secondary flow channel through a bottom thereof.

9. A method of packaging LED chips, comprising the steps of:
   providing a top mold,
   providing a bottom mold corresponding to said top mold, forming said bottom mold with a main flow channel, a series of receiving spaces disposed beside the main flow channel, a first of said receiving spaces of said series directly communicated with said main flow channel, a plurality of secondary flow channels for respectively and transversely communicating said first of said receiving spaces with a second of said receiving spaces each with the other, said second of said receiving spaces indirectly communicated with said main flow channel through said first of said receiving spaces, and a plurality of ejection pins penetrating through said bottom mold; wherein the plurality of secondary flow channels are alternately disposed at one lateral side between neighboring receiving spaces, thereby forming a plurality of continuous S-shaped communicated flow channels connecting said series of receiving spaces with said plurality of secondary flow channels;
   pressing a plurality of wire-bonded LED chips into corresponding of said plurality of receiving spaces by mating the top mold with the bottom mold;
   pouring package resins from the main flow channel into each of said plurality of receiving spaces through the secondary flow channels, thereby filling said each receiving space with package resins in direct contact with an inner surface of said each receiving space for packaging each wire-bonded LED chip in said package resins, wherein said ejection pins communicate at one end thereof directly with a bottom of said package resins;
   displacing the top mold upward, thereby separating the top mold from the LED chips packaged in said package resins; and
   pushing the packaged LED chips out of the bottom mold via the action of said plurality of ejection pins applied directly to the bottom of said package resins.

10. The method as claimed in claim 9, wherein the top mold has a plane facing the bottom mold for mating with the bottom mold.

11. The method as claimed in claim 9, wherein the receiving spaces are arranged in a matrix shape.

12. The method as claimed in claim 9, wherein each two secondary flow channels are formed at two opposite lateral sides between neighboring receiving spaces.

13. The method as claimed in claim 9, wherein the receiving spaces are formed beside the same side of the main flow channel.

14. The method as claimed in claim 9, wherein the receiving spaces are respectively formed beside two opposite sides of the main flow channel.

15. The method as claimed in claim 9, wherein each of said plurality of ejection pins is expansibly projected into a corresponding receiving space through a bottom thereof.

16. The method as claimed in claim 9, wherein each of said plurality of ejection pins is expansibly projected between neighboring receiving spaces into said each secondary flow channel through a bottom thereof.

17. The method as claimed in claim 9, wherein before the steps of providing the top mold and the bottom mold, the method further comprises the steps of:
   etching a substrate to form a plurality of chip carrying areas and a plurality of positive contact pins and negative contact pins that correspond to the chip carrying areas;
   arranging the LED chips on the corresponding chip carrying areas, respectively; and
   electrically connecting a positive pole and a negative pole of each LED chip with the corresponding positive contact pin and negative contact pin by a wire-bounding method.

* * * * *